US008531325B2

(12) United States Patent
Onódy

(10) Patent No.: US 8,531,325 B2
(45) Date of Patent: Sep. 10, 2013

(54) COMBINED COMPLEX REAL MODE DELTA-SIGMA ADC

(75) Inventor: Péter Onódy, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 44 days.

(21) Appl. No.: 13/249,208

(22) Filed: Sep. 29, 2011

(65) Prior Publication Data

US 2013/0083868 A1 Apr. 4, 2013

(51) Int. Cl.
*H03M 3/00* (2006.01)

(52) U.S. Cl.
USPC .......................................... 341/143; 375/235

(58) Field of Classification Search
USPC ................. 341/143, 139; 375/233, 235, 345, 375/350, 354, 221, 297; 455/234.1
See application file for complete search history.

(56) References Cited

U.S. PATENT DOCUMENTS 6,680,971 B1 * 1/2004 Tazebay et al. ............... 375/235
8,009,077 B1 8/2011 Melanson
8,018,365 B1 9/2011 Tsai
2010/0309032 A1 * 12/2010 Uo et al. ...................... 341/110

OTHER PUBLICATIONS

J. Arias, et al., "A dual-mode, complex, Delta-Sigma ADC in CMOS for Wireless-LAN receivers," Dpto de E. y Electrónica, E.T.S.I. telecomunicación, Universidad de Valladolid, Valladolid (Spain), 8 pages.

* cited by examiner

*Primary Examiner* — Joseph Lauture

(57) ABSTRACT

A delta-sigma analog-to-digital converter (ADC) is disclosed. In one embodiment, the delta-sigma ADC includes a dual mode resonator and a plurality of switches. The delta-sigma ADC is configured to operate in a real modulation mode or a complex modulation mode based on settings of the plurality of switches.

19 Claims, 8 Drawing Sheets

IN
DAC 13
Sum 12
Comp 14
OUT
10A
Amplifier 19
Switch 18
Summing Node 16
Integrator 15
Resistance 17

11R
17
1/R3
15
1/sC2
y
y2
19
a2
17
1/R1
y1
19
a1
15
1/sC1
16
17
1/R1
u

COMBINED COMPLEX REAL MODE DELTA-SIGMA ADC

BACKGROUND

1. Technical Field

This disclosure relates to electronic circuits, and more particularly, to analog-to-digital converters.

2. Description of the Relevant Art

Analog-to-Digital converters (ADCs) are well known in the electronic arts. A wide variety of applications use ADCs. Such applications include audio processing circuitry, wireless communications devices, and so forth. Different types of ADCs are available for different applications. One type of ADC is known as a delta-sigma ADC.

Delta-sigma ADC's may be useful in wireless communications systems given their ability to provide an output with little if any unwanted noise. For example, in low-IF (intermediate frequency) receivers in a wireless communications system, a delta-sigma ADC utilizing complex resonators may be implemented to perform the analog-to-digital conversion prior to digital signal processing. In another example, a zero-IF (or direct conversion) receiver in a wireless communications system may utilize a delta-sigma ADC having real resonators.

SUMMARY

A delta-sigma ADC s is disclosed. In one embodiment, the delta-sigma ADC includes a dual mode resonator and a plurality of switches. The delta-sigma ADC is configured to operate in a real modulation mode or a complex modulation mode based on settings of the plurality of switches.

In one embodiment, a method includes operating a delta-sigma analog-to-digital converter (ADC) in a first mode. The delta-sigma ADC includes a plurality of dual-mode resonators, wherein each of the dual-mode resonators has a first resonant frequency when operating in the first mode. The method further includes operating the delta-sigma ADC in a second mode. Each of the dual-mode resonators has a second resonant frequency when operating in the second mode.

In one embodiment, a radio receiver includes a downconversion stage configured to receive a radio frequency (RF) signal and further configured to downconvert the radio frequency signal to a reduced frequency signal. The radio receiver further includes a delta-sigma ADC having one or more dual-mode resonators and a plurality of switches. Each dual-mode resonator is configured to operate in a real modulation mode when each of the plurality of switches is in a first position, and wherein each dual-mode resonator is configured to operate in a complex modulation mode when each of the plurality of switches are in a second position. The delta-sigma ADC is configured to output a first bitstream corresponding to an in-phase component of the RF signal and a second bitstream corresponding to a quadrature component of the RF signal.

BRIEF DESCRIPTION OF THE DRAWINGS

Other aspects of the disclosure will become apparent upon reading the following detailed description and upon reference to the accompanying drawings which are now described as follows.

Figure 1:
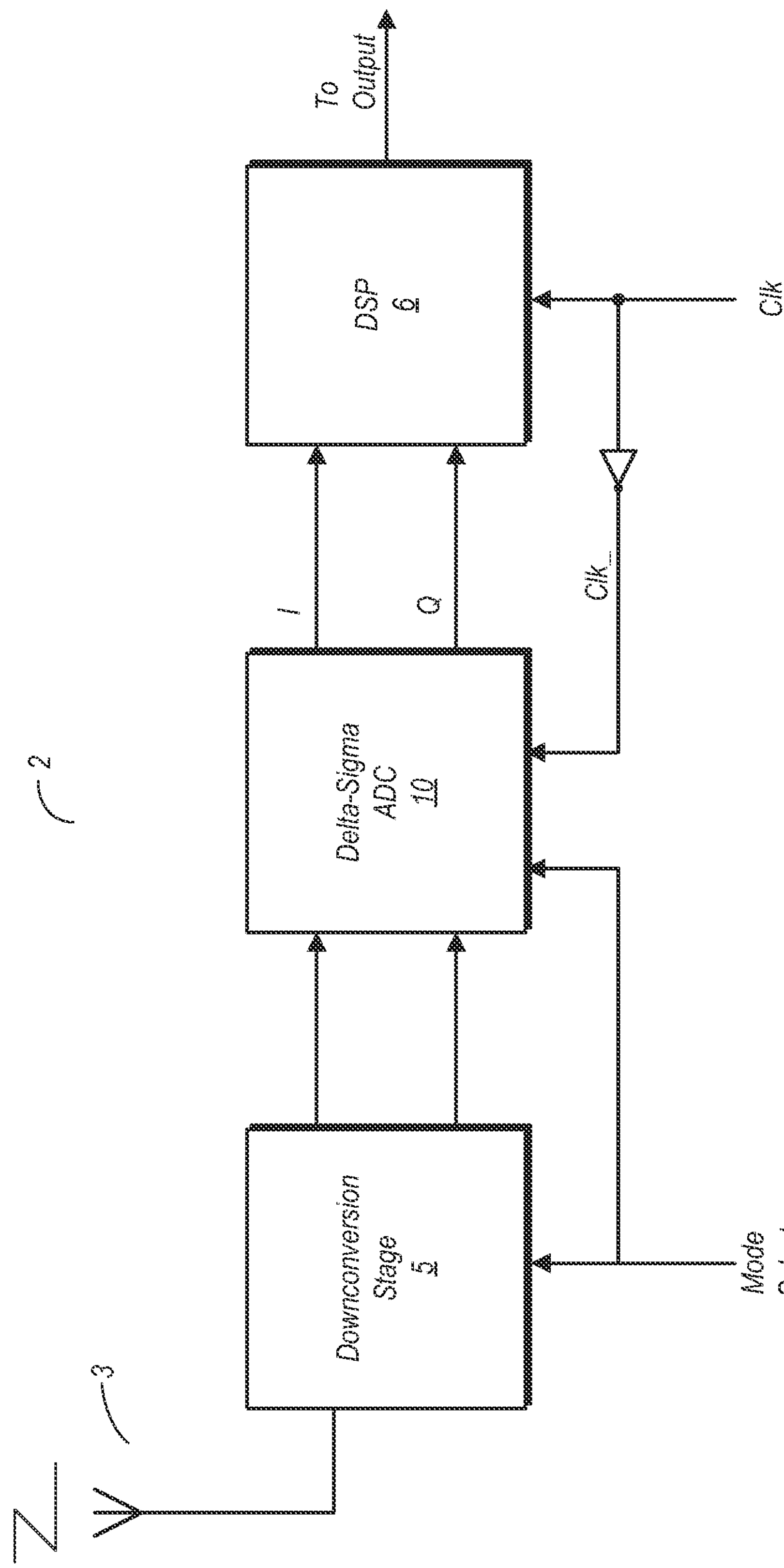
FIG. 1 is a block diagram illustrating one embodiment of a radio receiver including a delta-sigma analog-to-digital converter (ADC).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

Turning now to FIG. 1, a block diagram of one embodiment of a radio receiver is shown. In the illustrated example, radio receiver 2 includes an antenna 3 via which radio signals may be received by downconversion stage 5. Analog signals may be received from downconversion stage by delta-sigma ADC 10, which may convert the signals to digital format. Delta-sigma ADC 10 may output first and second bitstreams corresponding to in-phase (I) and quadrature (Q) components of a modulated signal, for example a quadrature amplitude modulated (QAM) signal, received by radio receiver 2. In general, any modulation scheme producing two components may be used. The to bitstreams may be received by digital signal processing (DSP) unit 6 for further processing. In one embodiment, DSP unit 6 may include respective latches for sampling the data received from delta-sigma ADC 10. Operation of the latches may be synchronized to a clock signal (CLK) received by DSP unit 6. DSP unit 6 may perform various types of processing and provide processed signals as an output. Exemplary types of data provided by DSP unit 6 may be voice data, display data, or network transmission data in a network utilizing wireless routers, among others. A complement of the clock signal (CLK_) may be provided to delta-sigma ADC 10. Thus, delta-sigma ADC 10 may sample data on the falling edge of the clock signal (rising edge of the complement of the clock signal), while DSP 6 samples data on the rising edge of the clock signal.

Receiver 2 in the embodiment shown is a dual-mode receiver. More particularly, receiver 2 may operate as a direct conversion (or zero-IF) receiver in a first mode. In a second mode, receiver 2 may operate as a heterodyne receiver (e.g., as a low-IF receiver). Downconversion unit 5 in the embodiment shown includes at least one local oscillator and a mixer configured to downconvert the received radio frequency (RF) signal to either a baseband frequency or to an intermediate frequency (IF), depending on the mode of operation. In one embodiment of downconversion unit 5, a local oscillator may be configured to provide either a baseband frequency or IF to a mixer in order to output a modulated signal at the baseband frequency or the IF for further processing. In another embodiment, separate local oscillators, one for operation in the direct conversion mode and one for operation in the IF mode, are provided. Downconversion unit 5 may also provide additional components, such as filters, automatic frequency control (AFC) circuitry, and so forth.

In order for receiver 2 to operate in both the direct conversion mode and the IF mode, delta-sigma ADC 10 may be correspondingly configured to operate in different modes. When operating in the direct conversion mode, delta-sigma ADC may operate in to a real modulation mode (hereinafter 'real mode'). When operating in the IF mode, delta-sigma ADC may operate in a complex modulation mode (hereinafter 'complex mode'). As will be explained in further detail below, switching between the two modes may be accomplished by changing the resonant frequency and topology of dual-mode resonators of delta-sigma ADC 10. More particularly, the resonant frequency of the resonators may be changed by changing the resistance portion of an RC time constant applicable to integrators within the dual-mode resonators of delta-sigma ADC 10.

Figure 2:
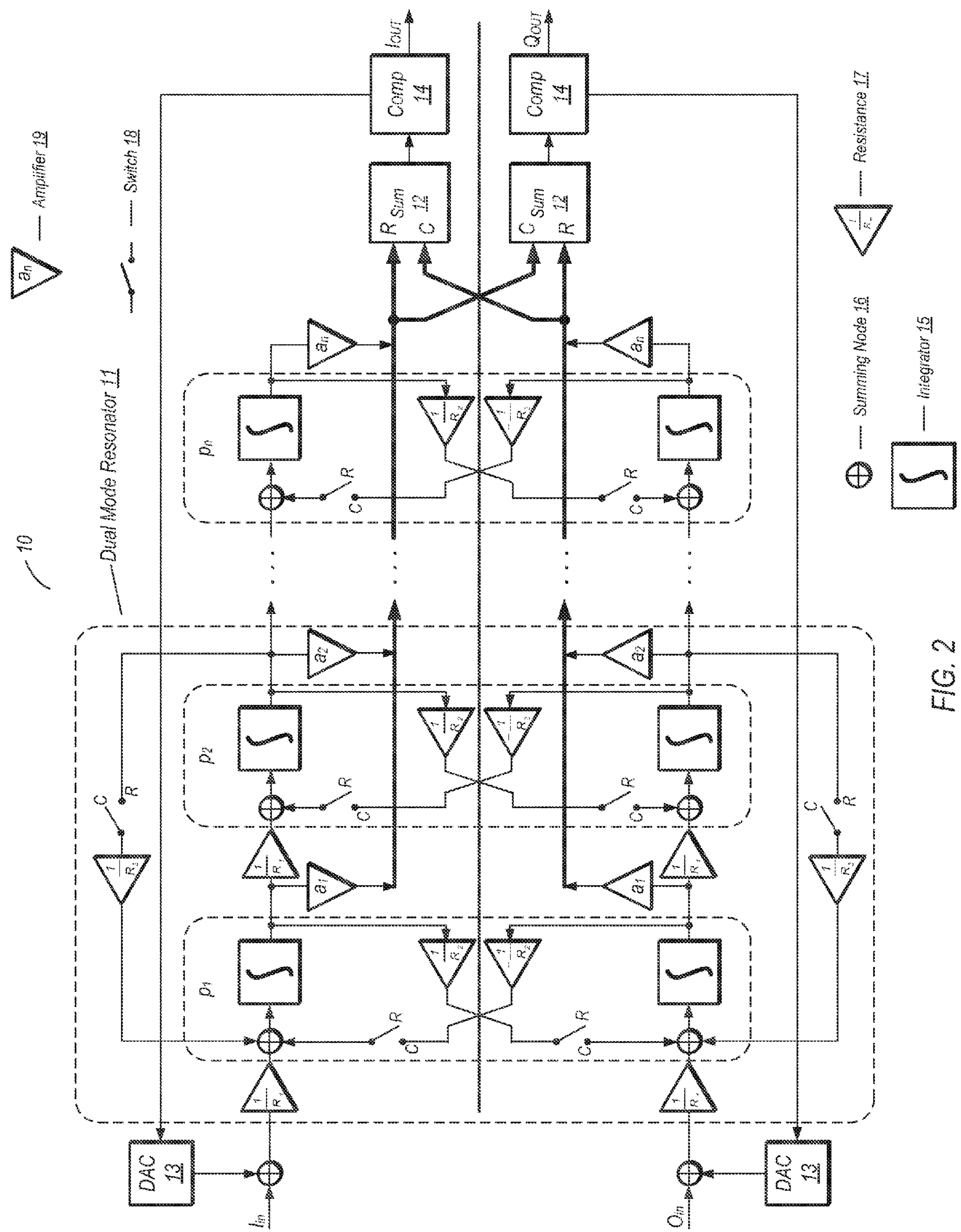
FIG. 2 is a block diagram illustrating one embodiment of a delta-sigma ADC having dual-mode resonators.
Figure 3:
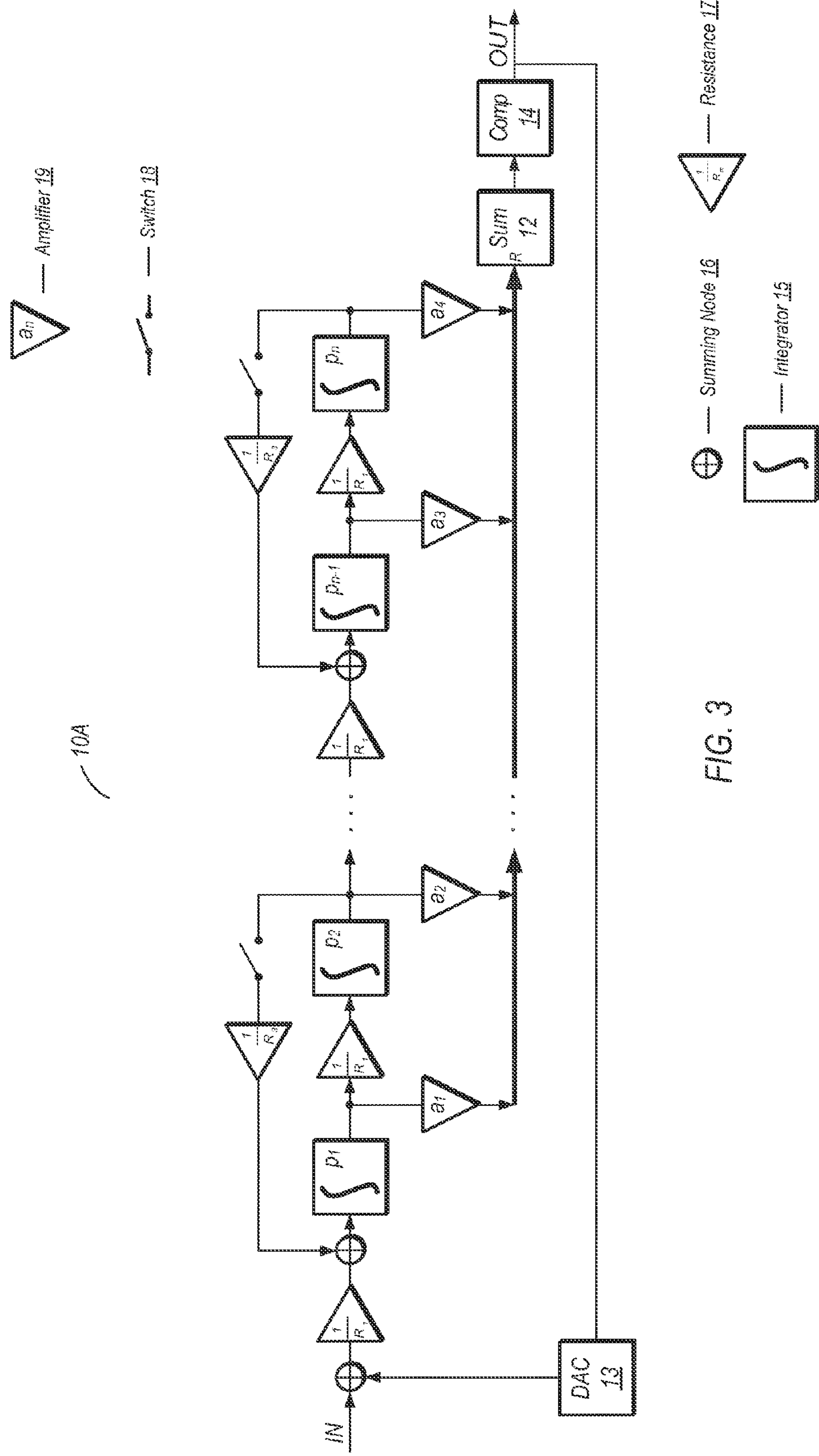
FIG. 3 is a block diagram illustrating one embodiment of a portion of the delta-sigma ADC when arranged to operate in a real modulation mode.

Turning now to FIG. 2, a block diagram illustrating one embodiment of delta-sigma ADC 10 is shown. In the embodiment shown, delta-sigma ADC 10 is a continuous time (CT) delta-sigma ADC that includes one or more dual-mode resonators 11. Embodiments that are not CT delta-sigma ADC's are also possible and contemplated. Only one dual-mode resonator 11 is illustrated here for the sake of simplicity. It is understood however that various embodiments of delta-sigma ADC may be implemented with any number dual-mode resonators 11. When multiple dual-mode resonators are implemented, delta-sigma ADC 10 may be arranged in a cascaded resonator feed forward topology. The dual-mode resonators 11 of delta-sigma ADC 10 are arranged to realize desired transfer functions for operation in each of the real and complex modes. The number of dual-mode resonators 11 may thus be a function of the transfer functions corresponding to each of these modes, and more particularly, the order of the transfer functions. The transfer functions implemented by delta-sigma ADC 10 may include a number of coefficients. The coefficients are physically realized here by amplifiers 19, each of which may have a gain corresponding to a coefficient. The product output by amplifiers 19 may be forwarded to summing circuits 12.

When operating in the real mode, each of the dual-mode resonators 11 may be configured as two separate and independent real resonators. A block diagram of a real resonator formed when operating in the real mode is discussed below in reference to FIG. 4. When operating in the complex mode, each of the dual-mode resonators 11 may be configured as two serially coupled complex resonators. A block diagram of a complex resonator formed when operating in the complex mode is discussed below in reference to FIG. 5. In the embodiment shown, delta-sigma ADC 10 includes a plurality of switches 18 which may be used to switch between the real and complex modes. In the embodiment shown, each of switches 18 may be in one of a first position or a second position. The first position, labeled 'R', corresponds to operation in the real mode. The second position, labeled 'C', corresponds to operation in the complex mode. Delta-sigma ADC 10 in the embodiment shown may be configured such that all switches 18 are either in the R position or the C position at any given time when not actually in the process of changing positions.

In the embodiment shown, each of the dual-mode resonators 11 includes a plurality of integrators 15. In this embodiment, each dual-mode resonator 11 includes four integrators 15. Each integrator 15 may perform a time integration of an input voltage received on its input. The input voltage received by each integrator 15 may be affected by the resistances coupled to the its input. More particularly, the RC time constant of the integrator is based on both an associated resistance and an associated capacitance. Thus, changing the RC time constant may be accomplished by changing either of the resistance or capacitance (or both). In the embodiment of delta-sigma ADC 10 shown in FIG. 10, the RC time constant associated with each integrator 15 may be changed by changing the resistance. Changing the resistance may be accomplished by changing the position of each of switches 18. When integrators 15 are coupled in a configuration as shown in FIG. 2, changes to the resistances (and thus to the RC time constant associated with the integrators 15) may in turn change a resonant frequency of the dual-mode resonators 11. Changing the RC time constant by changing the resistance may provide fewer parasitic parameters than would result from changing the capacitance. This in turn may result in a lower current consumption and less circuit area than required for a dual-mode delta-sigma ADC implemented with a variable capacitance for switching modes.

The resistances coupled to the respective inputs of each of integrators 15 in the embodiment shown may be dependent upon the position of the switches. In the embodiment shown, delta-sigma ADC 10 implements a number of resistances 17 (which are symbolically illustrated here as conductances). Signals encountering these resistances may be summed at summing nodes 16. Each summing node 16 is coupled to an input of a corresponding integrator 15. For example, the summing nodes 16 in block P1 of dual-mode resonator 11 are each coupled to receive signal through resistors having resistances R1 and R3 when operating in the real mode. The summing nodes 16 in block P1 are each coupled to receive signals through resistors having resistances R1 and R2 when operating in the complex mode.

Delta-sigma ADC 10 in the embodiment shown includes two dual-input summing circuits 12. Each of the summing circuits 12 may receive signals output from amplifiers 19, each of which applies a weighting factor according to a coefficient to an output of a corresponding integrator 12. The inputs summed in a particular summing unit 12 are dependent on whether delta-sigma ADC 10 is operating in the real mode or the complex mode. When operating in the complex mode, the inputs to each summing circuit 12 are cross-coupled from the other portion of delta-sigma 10. For example, the bottom portion of delta-sigma ADC 10 (as shown in FIG. 2) may provide inputs to the complex inputs of summing circuit 12 in the top portion when operating in the complex mode. Otherwise, when operating in the real mode, each summing circuit 12 may receive through its real inputs signals from its corresponding half of delta-sigma ADC 10 as shown (e.g., the upper summing circuit 12 receives signals through the R input from the upper half of delta-sigma ADC 10).

The configuration of one half of delta-sigma ADC 10 when operating in the real mode is illustrated in FIG. 2. When operating in the real mode, delta-sigma ADC 10 is effectively operating as two separate and independent real delta-sigma ADC's.

Returning to FIG. 2, each summing circuit 12 may add the voltages of the signals received. The sum of the voltages may be output to compare unit 14. Based on the voltage received at any given time (e.g., in a given clock cycle), compare unit 14 may determine whether or not the voltage corresponds to a logic 1 or a logic 0. The correspondingly determined logic 1 or logic 0 may be captured into a latch and output from delta-sigma ADC 10. Compare unit 14 in the upper portion shown in FIG. 2 is configured to output the I component of a QAM signal. Compare unit 14 in the low portion of FIG. 2 is configured to output the Q component of the QAM signal. In addition, the digital output provided by compare units 14 is fed back to digital-to-analog converters 13 and provided to respective summing nodes 16 to be combined with the input signals.

Figure 4:
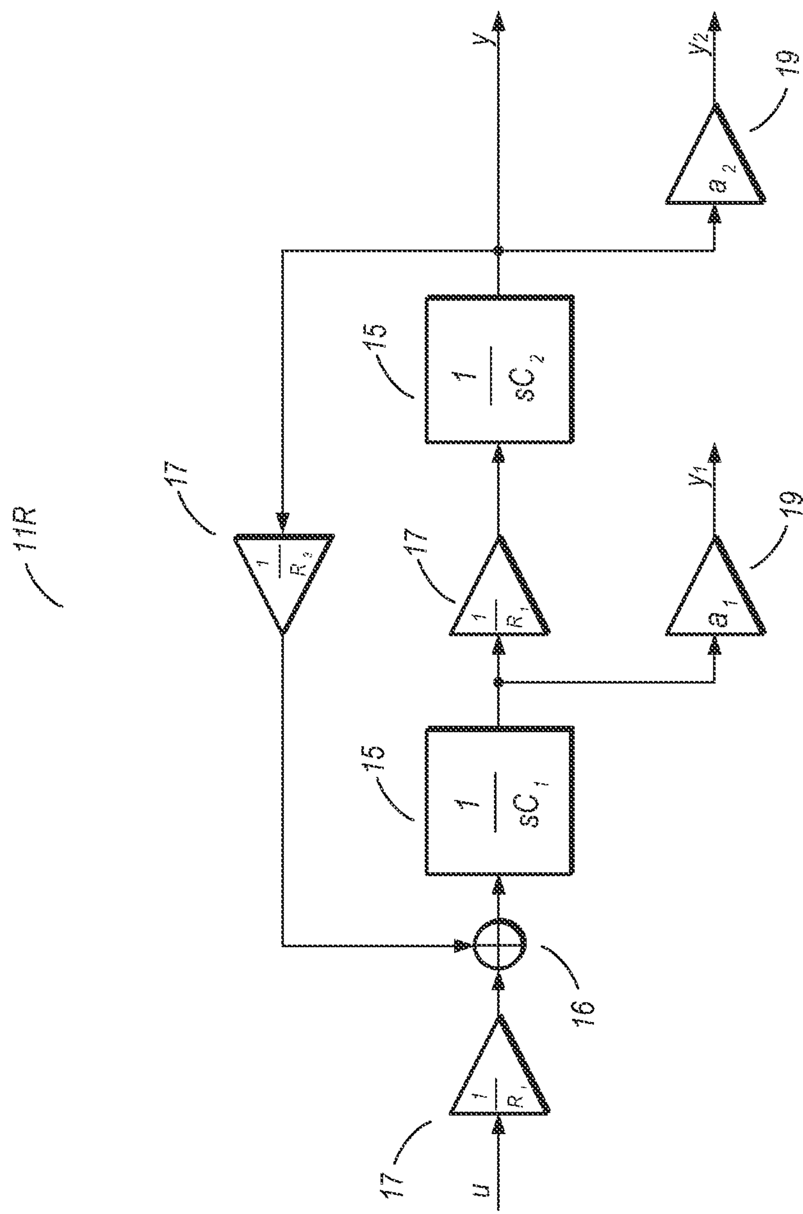
FIG. 4 is a block diagram illustrating a real resonator formed when one embodiment of the dual-mode resonator is operating in the real modulation mode.

FIG. 4 is a block diagram of a real resonator formed when the dual-mode resonators 11 of one embodiment of delta-sigma ADC 10 is operating in the real mode. In the embodiment shown, real resonator 11R is one of two real resonators formed when dual-mode resonator 11 of FIG. 2 is operating in the real mode. The two real resonators formed when dual-mode resonator is operating in the real mode may operate separately and independent from one another.

Real resonator 11R includes two integrators 15. The output of each integrator 15 is coupled to an amplifier 19 configured to amplify its respective output by a gain value corresponding to a coefficient. An input to a first integrator 15 is coupled to a summing node 16. When dual-mode resonator 11 is configured in the real mode, resistors R1 and R3 of real resonator 11R are coupled to summing node 16. Accordingly, an input signal received by the first integrator 15 is based on a sum of the signals passing through R1 and R3. Resistor R3 is coupled in a feedback loop between the output of the second integrator 15 when dual-mode resonator 11 is in the real mode. An input signal passed to the second integrator 15 in the embodiment shown is received through resistor R1, with no additional resistors coupled to the respective input.

The outputs of real resonator 11 may be applied to the real inputs of summing circuit 12 or to a next real resonator. In this example, outputs y1 and y2 from respective amplifiers 19 may be provided to the real inputs of summing circuit 12. The output y from the second integrator 15 may be provided to either the real inputs of summing circuit 12 or to a first integrator of next real resonator 11R coupled in series.

It is noted that the terms of the transfer functions shown in the blocks representing integrators 15 are exemplary. The actual terms may vary from one embodiment to the next, dependent upon the specific implementation.

Figure 5:
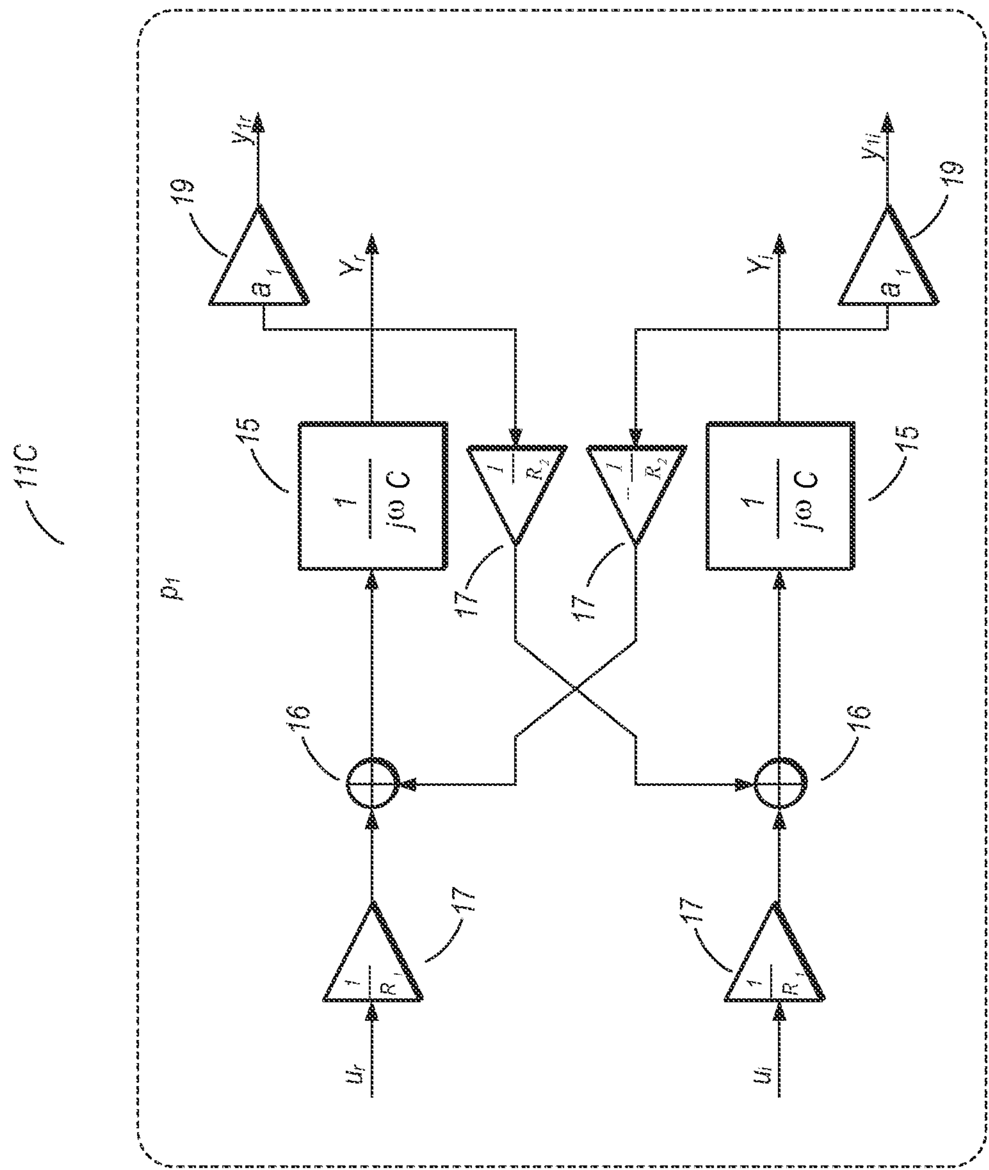
FIG. 5 is a block diagram illustrating one embodiment of a complex resonator formed when one embodiment of the dual-mode resonator is operating in a complex modulation mode.

FIG. 5 is a block diagram of a complex resonator formed when an embodiment of dual-mode resonator 11 is operating in the complex mode. Complex resonator 11C is one of two serially-coupled complex resonators formed within dual-mode resonator 11 of FIG. 2 when operating in the complex mode.

In the embodiment shown, the integrators 15 of complex resonator 11C are effectively cross-coupled to one another. A summing node 16 at the input of each integrator 15 is coupled to resistors R1 and R2. Each resistor R2 is further coupled to the output of the other integrator 15. Accordingly, an input signal to each of integrators 15 is partially dependent on the output signal provided by the other integrator 15. Furthermore, the RC time constant associated with each integrator 15, and thus the resonant frequency of complex resonator 11C, is dependent upon both R1 and R2 along with the respective integrator capacitances.

Complex resonator 11C is configured to provide both real (Yr) and imaginary (Yi) inputs representative of the real and imaginary components of a complex number. These inputs may be coupled to inputs of another complex resonator 11C within the dual-mode resonator 11 in which they are formed, to the inputs of another dual-mode resonator 11, or to the C inputs of a summing circuit 12 in accordance with the arrangement shown in FIG. 2. In addition, complex resonator 11C is also configured to provide real (Y1*r*) and imaginary (Y1*i*) outputs weighted by coefficients, via amplifiers 19, to the correspondingly coupled complex inputs of a summing circuit 12.

Figure 6:
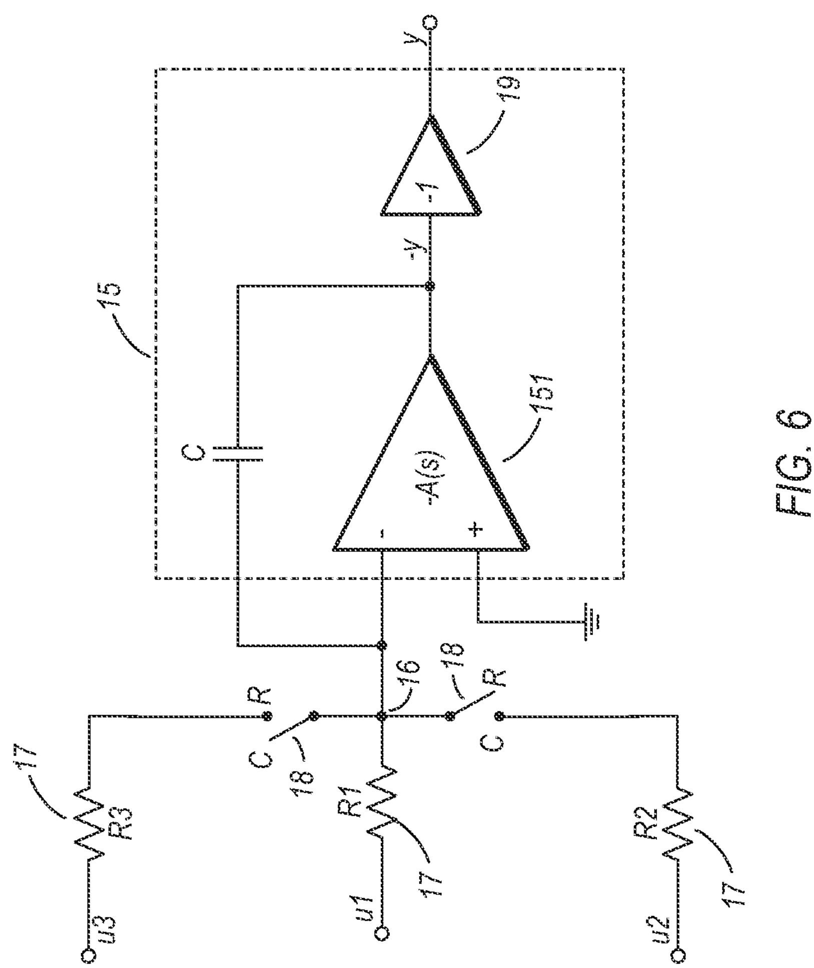
FIG. 6 is a block diagram illustrating one embodiment of an integrator used in one embodiment of a dual-mode resonator.

FIG. 6 is a diagram illustrating one embodiment of an integrator 15 and its corresponding resistor inputs. In the embodiment shown, integrator 15 is an operation amplifier (op-amp) integrator having a capacitor C coupled between the output and the inverting input of op-amp 151. The resistance inputs to integrator 15 are dependent on the mode of operation. Resistor R1 is coupled to summing node 16, and thus the inverting input of op-amp in both the real and complex modes of operation. When operating in the complex mode (and thus when switches 18 are in the C position), resistors R2 and R1 are both coupled to the inverting input of integrator 15. Accordingly, the RC time constant associated with integrator 15 is dependent on resistors R1 and R2, along with the capacitance value of the capacitor coupled as negative feedback.

In the illustrated example, real mode operation (occurring when switches 18 are in the R position) couples resistor R3 to summing node 16. Accordingly, in the real mode of operation, the RC time constant associated with integrator 15 is dependent upon resistors R1 and R3 along with the capacitance of the capacitor coupled as negative feedback. It is noted that the second integrator 15 in real resonator 11R as shown in FIG. 4 is not arranged to be coupled to resistor R3, and thus in that particular case only R1 has any effect on the corresponding RC time constant.

The output of op-amp 15, in addition to be coupled to the negative feedback loop, is also provided to an input of amplifier 19. Due to the negative feedback loop, the output of op-amp 15 is '−y'. Accordingly, amplifier 19 as shown in FIG. 6 may invert the output of op-amp 15, resulting in an output of 'y' from integrator 15.

Figure 7:
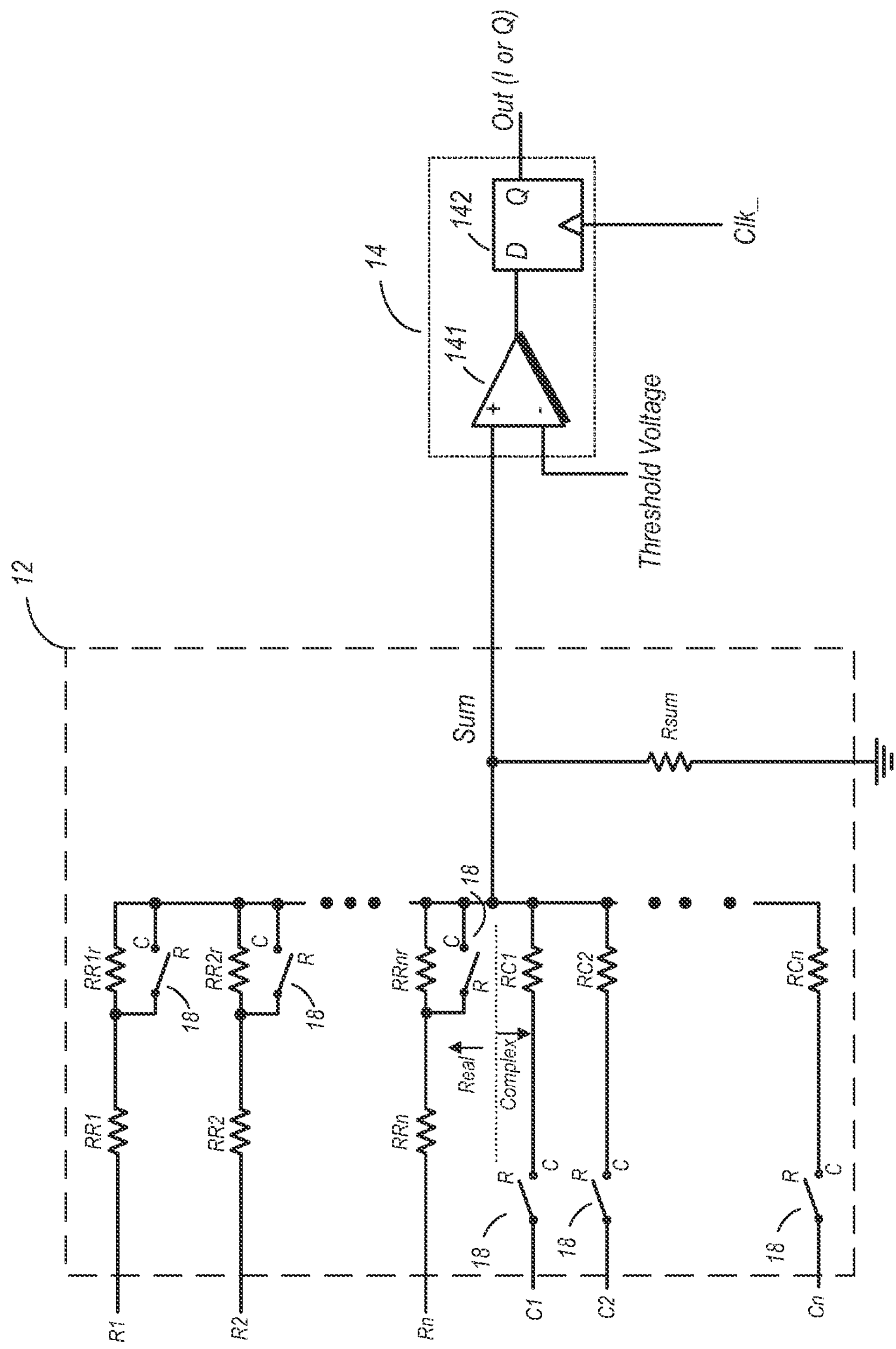
FIG. 7 is a schematic diagram illustrating one embodiment of a summing circuit coupled to one embodiment of a comparator.

FIG. 7 is a diagram illustrating respective embodiments of summing circuit 12 and compare unit 14. In the embodiment shown, summing circuit 12 includes a number of real inputs (e.g., R1, R2, etc.) and a number of complex inputs (e.g., C1, C2, etc.). The inputs may be received from various dual-mode resonators 11 as shown in the arrangement of FIG. 2. The real inputs in the embodiment shown coupled to corresponding resistors. For example, when operating in the real mode, input R1 may be coupled to resistor RR1, input R2 may be coupled to resistor RR2, and so forth. When operating in the real mode, additional resistors may be present in the signal paths between respective real inputs and the summing node (SUM). For example, RR1*r* is coupled between RR1 and the summing node when operating in the real mode, RR2*r* is coupled between RR2 and the summing node, and so on. When operating in the complex mode, input C1 may be coupled to resistor RC1, input C2 may be coupled to resistor RC2, and so forth, via corresponding switches 18. Furthermore, a portion of the resistances corresponding to the real component may be eliminated by shorting them out using additional switches 18. For example, when operating in the complex mode, resistor RR1*r* may be shorted out by a switch 18, and so on. It is noted however that in the design of certain embodiments, the resistances may be optimized, and thus at least some of these resistances may not be shorted out.

The resistors of both the real and complex portion of summing circuit may be arranged in a resistor ladder topology. The signal inputs received from the dual-mode resonators 11 may be in the form of voltages. Accordingly, the sum of the signals resulting on the sum node (and across resistor Rsum) is also a voltage. This sum voltage may be input into the non-inverting input of comparator 141 and compared to a threshold voltage. Comparator 141 may output a high if the sum voltage exceeds the threshold voltage, and may otherwise output a low. Compare unit 14 also includes a latch 142 in this embodiment, which is configured to sample the output of comparator 14 at a rate determined by the input clock signal. The input clock signal (CLK), and thus the sampling rate, may be significantly greater than the Nyquist frequency (i.e. 2 times the maximum frequency) of the input signal in accordance with delta-sigma ADC operation. Although not explicitly shown, compare unit 14 may also include a decimator coupled to the output of latch 14 in order to reduce the number of samples of the output bitstream. Alternatively, a decimator may be included in a DSP unit coupled to receive the bitstream. The output bitstream as shown in FIG. 7 may be one of the I and Q components of the digitally-converted QAM signal.

Figure 8:
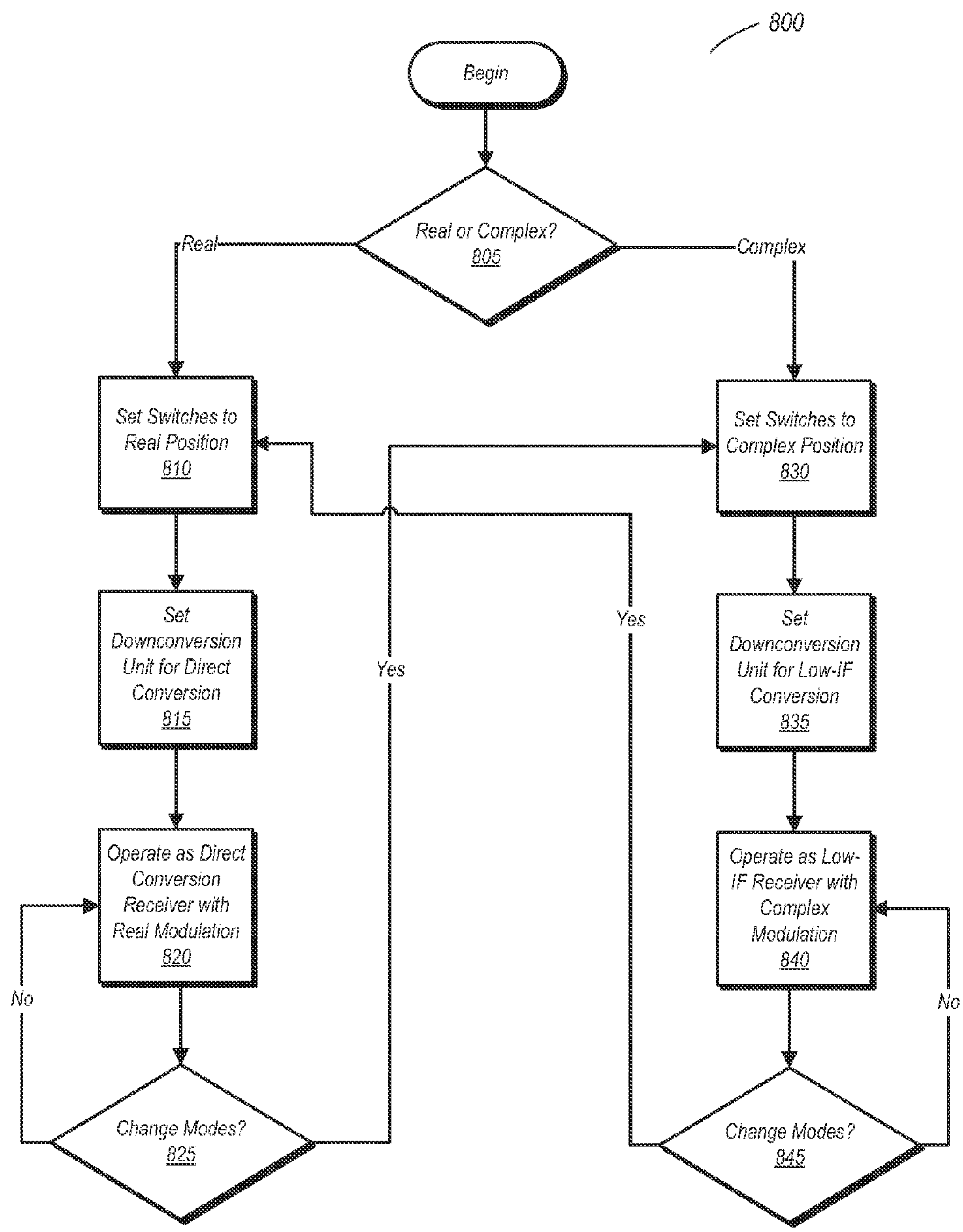
FIG. 8 is a method flow diagram illustrating one embodiment of a method for operating a radio receiver having a dual-mode delta-sigma ADC.

Turning now to FIG. 8, a method flow diagram of one embodiment of a method for operating a radio receiver having a dual-mode delta-sigma ADC is illustrated. The method may apply to any radio receiver, including that shown in FIG. 1, that includes a delta-sigma ADC 10 as shown in FIG. 2 and is further configured for dual-mode operation as described herein.

In the embodiment shown, method 800 begins with a determination of the operational mode (block 805). If the operational mode is the real mode (block 805, the 'real' path), each of the switches may be set to the real position (block 810). Setting the switches to the real position may have the affect of configuring each of a number of dual-mode resonators as two separate and independent real mode resonators. Setting the switches to the real position may have the additional affect of setting the resistances associated with each integrator of the real mode resonators and correspondingly setting a correspondingly respective RC time constant. The RC time constant for each of the integrators may determine a resonant frequency of the real mode resonators.

In addition to setting the switches to the real position, a downconversion unit may also be configured into a direct conversion (or zero-IF) receiver architecture (block 815). Thereafter, operation of the receiver may commence, with the receiver operating in a direct conversion, real modulation mode (block 820). This operation may continue if no request to change modes is made (block 825, the 'no' path).

If the operational mode is to be changed (block 825, the 'yes' path), or the initial mode selection is complex (block 805, the 'complex' path), then each of the switches of the delta-sigma ADC may be set to the complex position (block 830). Changing the position of the switches to the complex position may have the affect of changing the resistances of the corresponding RC time constants for each integrator of the dual-mode resonators. Correspondingly, the resonant frequency of each of the dual-mode resonators may also change. The downconversion unit may be configured into a heterodyne (e.g., low-IF) receiver architecture (block 835). Thereafter, operations as a heterodyne receiver with complex modulation may commence (block 840), with such operation continuing in the absence of any requests to change the operational mode (block 845, the 'no' path). If a request is received to change the operational mode (block 845, the 'yes' path), then the switches may be set to the real position (block 810), with the previously described real mode configuration and operation commencing.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:

a delta-sigma analog-to-digital-converter (ADC) having a dual-mode resonator and a plurality of switches, wherein the dual-mode resonator is configured to operate in a real modulation mode or a complex modulation mode based on settings of the plurality of switches, wherein the dual-mode resonator includes a plurality of integrators and is configured to provide a first resistance for a first resistive-capacitive (RC) time constant of each of a plurality of integrators when each of the plurality of switches is in a first position, and further configured to provide a second resistance for a second RC time constant of each of the plurality of integrators when each of the plurality of switches is in a second position.

2. The apparatus as recited in claim 1, wherein the dual-mode resonator is configured, when each of the switches is in a real mode position, to operate as a first real resonator and a second real resonator, wherein the first and second real resonators are independent from one another.

3. The apparatus as recited in claim 2, wherein each of the first and second real resonators includes:

a first resistor of a first resistance value;

a first integrator having an input coupled to the first resistor;

a second resistor of the first resistance value coupled to an output of the first integrator;

a second integrator having an input coupled to the second resistor; and a feedback loop having a third resistor of a second resistance value coupled between an output of the second integrator and the input of the first integrator.

4. The apparatus as recited in claim 3, further comprising a first amplifier coupled to the output of the first integrator and a second amplifier coupled to the output of the second integrator.

5. The apparatus as recited in claim 1, wherein the dual-mode resonator is configured, when each of the switches is in a complex mode position, to operate as first and second complex resonators.

6. The apparatus as recited in claim 5, wherein each of the first and second complex resonators includes:

a first resistor of a first resistance value;

a first integrator having a corresponding input coupled to the first resistor;

a second resistor of the first resistance value;

a second integrator having a corresponding input coupled to the second resistor;

a third resistor having a second resistance value coupled between an output of the first integrator and the input of the first integrator; and a fourth resistor having the second resistance value coupled between an output of the second integrator and the input of the first integrator.

7. The apparatus as recited in claim 6, further comprising a first amplifier coupled to the output of the first integrator and a second amplifier coupled to the output of the second integrator.

8. The apparatus as recited in claim 1, further comprising:

a first summing circuit having a first plurality of real inputs and a first plurality of complex inputs, wherein each of the first plurality of real inputs is coupled to corresponding ones of each of a first plurality of amplifiers and wherein the first plurality of complex inputs are coupled to corresponding ones of each of a second plurality of amplifiers;

a second summing circuit having a second plurality of real inputs and a second plurality of complex inputs, wherein each of the second plurality of real inputs is coupled to corresponding ones of each of the second plurality of amplifiers and wherein each of the second plurality of complex inputs is coupled to corresponding ones of each of the first plurality of amplifiers.

9. The apparatus as recited in claim 8, wherein the first and second summing circuits are configured to select the first plurality of real inputs and the second plurality of real inputs, respectively, when each of the plurality of switches is in a real mode position, and wherein the first and second summing circuits are configured to select the first plurality of complex inputs and the second plurality of complex inputs, respectively, when each of the plurality of switches is in a complex mode position.

10. The apparatus as recited in claim 9, further comprising a first comparator coupled to receive a first voltage output from the first summing circuit and a second comparator coupled to receive a second voltage output from the second summing circuit, wherein the first and second comparators are configured to compare the first and second voltages, respectively, to a threshold voltage, wherein each of the first and second comparators are configured to output one of a logic zero or a logic one based on respective comparisons to the threshold voltage, wherein the first comparator is configured to output a bit stream corresponding to an in-phase component of a quadrature amplitude modulated (QAM) signal, and wherein the second comparator is configured to output a quadrature component of the QAM signal.

11. A method comprising:

operating a delta-sigma analog-to-digital converter (ADC) in a first mode, wherein the delta-sigma ADC includes a plurality of dual-mode resonators, wherein each of the dual-mode resonators has a first resonant frequency when operating in the first mode;

operating the delta-sigma ADC in a second mode, wherein each of the dual-mode resonators has a second resonant frequency when operating in the second mode.

12. The method as recited in claim 11, further comprising switching between the first and second modes by changing a resistance of a resistive-capacitive (RC) time constant for each of a plurality of integrators of each dual-mode resonator.

13. The method as recited in claim 11, wherein the first mode is a real modulation mode and wherein the second mode is a complex modulation mode.

14. The method as recited in claim 13, wherein operating in the real modulation mode comprises:

configuring each of the dual-mode resonators to operate as a first real resonator and a second real resonator, wherein the first and second real resonators are configured to operate independently of one another, wherein configuring each of the dual-mode resonators to operate as a first real resonator and a second real resonator comprises setting each of a plurality of switches to a first position.

15. The method as recited in claim 13, wherein the second mode is a complex modulation mode, and wherein operating in the complex mode comprises:

configuring each of the dual-mode resonators to operate as first and second complex resonators, wherein each of the first and second complex resonators includes first and second cross-coupled integrators, and wherein configuring each of the dual-mode resonators to operate as first and second serially-coupled complex resonators comprises setting each of a plurality of switches to a second position.

16. The method as recited in claim 11, further comprising:

adding a first plurality of real signal voltages and adding a second plurality of real signal voltages when operating in the real modulation mode, and;

adding a first plurality of complex signal voltages and adding a second plurality of complex signal voltages when operating in the complex modulation mode.

17. The method as recited in claim 16, further comprising:

performing first comparisons of voltages output from the first summing circuit to a threshold voltage;

outputting a first bit stream based on said first comparisons, wherein the first bit stream corresponds to an in-phase portion of a quadrature amplitude modulated (QAM) signal;

performing second comparisons of voltages output from the second summing circuit to the threshold voltage; and outputting a second bit stream based on said second comparisons, wherein the second bit stream corresponds to a quadrature phase portion of the QAM signal.

18. A radio receiver comprising:

a downconversion stage configured to receive a radio frequency (RF) signal and further configured to downconvert the signal to a reduced frequency signal; and a delta-sigma analog-to-digital-converter (ADC) having one or more dual-mode resonators and a plurality of switches, wherein each dual-mode resonator is configured to operate in a real modulation mode when each of the plurality of switches is in a first position, and wherein each dual-mode resonator is configured to operate in a complex modulation mode when each of the plurality of switches are in a second position;

wherein the delta-sigma ADC is configured to output a first bitstream corresponding to an in-phase component of the RF signal and a second bitstream corresponding to a quadrature component of the RF signal.

19. The radio receiver as recited in claim 18, wherein the downconversion stage is configured to downconvert a quadrature amplitude modulated (QAM) signal from the RF to a baseband frequency when operating in the real modulation mode, and wherein the downconversion stage is configured to downconvert the QAM signal from the RF to an intermediate frequency (IF) when operating in the complex modulation mode.

* * * * *